United States Patent
Wu et al.

(10) Patent No.: US 10,811,322 B1
(45) Date of Patent: Oct. 20, 2020

(54) DIFFERENT GATE WIDTHS FOR UPPER AND LOWER TRANSISTORS IN A STACKED VERTICAL TRANSPORT FIELD-EFFECT TRANSISTOR STRUCTURE

(71) Applicant: International Business Machines Corporation, Armonk, NY (US)

(72) Inventors: Heng Wu, Guilderland, NY (US); Kangguo Cheng, Schenectady, NY (US); Chen Zhang, Albany, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 16/379,950

(22) Filed: Apr. 10, 2019

(51) Int. Cl.
*H01L 21/8238* (2006.01)
*H01L 29/78* (2006.01)
*H01L 21/265* (2006.01)
*H01L 29/10* (2006.01)
*H01L 29/66* (2006.01)
(Continued)

(52) U.S. Cl.
CPC ...... *H01L 21/82385* (2013.01); *H01L 21/266* (2013.01); *H01L 21/26526* (2013.01); *H01L 21/26586* (2013.01); *H01L 21/823807* (2013.01); *H01L 21/823878* (2013.01); *H01L 21/823885* (2013.01); *H01L 27/0922* (2013.01); *H01L 29/0649* (2013.01); *H01L 29/1037* (2013.01); *H01L 29/42376* (2013.01); *H01L 29/66553* (2013.01); *H01L 29/7827* (2013.01)

(58) Field of Classification Search
CPC ............. H01L 29/7813; H01L 29/7802; H01L 29/7827; H01L 29/6666; H01L 29/0898; H01L 29/785; H01L 27/0688

USPC .................. 257/329, 328, 334; 438/212, 268
See application file for complete search history.

(56) References Cited

U.S. PATENT DOCUMENTS 5,612,563 A   3/1997   Fitch et al.
9,287,357 B2  3/2016   Rodder et al.
(Continued)

FOREIGN PATENT DOCUMENTS

WO   2017065920 A1   4/2017

OTHER PUBLICATIONS

K.G. Anil et al., "Layout Density Analysis of FinFETs," 33rd Conference on European Solid-State Device Research, Oct. 2003, 4 pages.

*Primary Examiner* — Thinh T Nguyen
(74) *Attorney, Agent, or Firm* — Vazken Alexanian; Ryan, Mason & Lewis, LLP

(57) ABSTRACT

A method of forming a semiconductor structure includes forming vertical fins comprising a first semiconductor layer, an isolation layer and a second semiconductor layer, the first and second semiconductor layers providing vertical transport channels for lower and upper vertical transport field-effect transistors (VTFETs) of a stacked VTFET structure. The method also includes forming a first gate stack for the lower VTFET surrounding a first portion of the first semiconductor layer of the vertical fins. The method further includes forming a second gate stack for the upper VTFET surrounding a second portion of the second semiconductor layer of the vertical fins. The first and second portions have different sizes such that the upper and lower VTFETs of the stacked VTFET structure have different effective gate widths.

20 Claims, 10 Drawing Sheets

(51) Int. Cl.
*H01L 27/092* (2006.01)
*H01L 29/06* (2006.01)
*H01L 29/423* (2006.01)
*H01L 21/266* (2006.01)

(56) References Cited

U.S. PATENT DOCUMENTS

| | | |
|---|---|---|
| 9,397,104 B2 | 7/2016 | Zhu et al. |
| 9,660,028 B1 | 5/2017 | Cheng et al. |
| 9,935,018 B1 | 4/2018 | Xie et al. |
| 10,038,054 B2 | 7/2018 | Rachmady et al. |
| 10,153,306 B2 | 12/2018 | Lee et al. |
| 2006/0128088 A1* | 6/2006 | Graham et al. ... H01L 29/66742 438/202 |
| 2013/0001701 A1 | 1/2013 | Christensen et al. |
| 2017/0294356 A1 | 10/2017 | Yeh et al. |

* cited by examiner

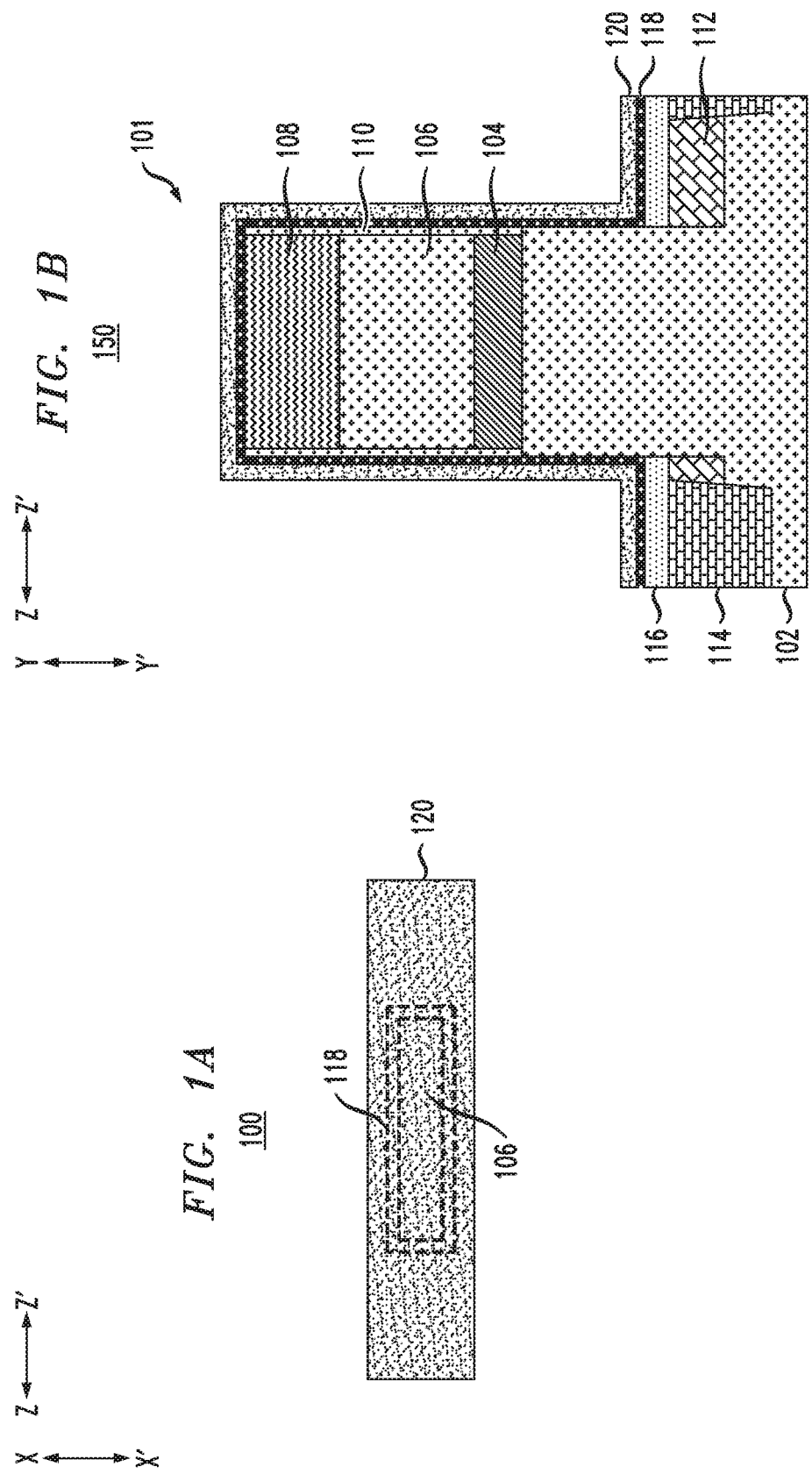

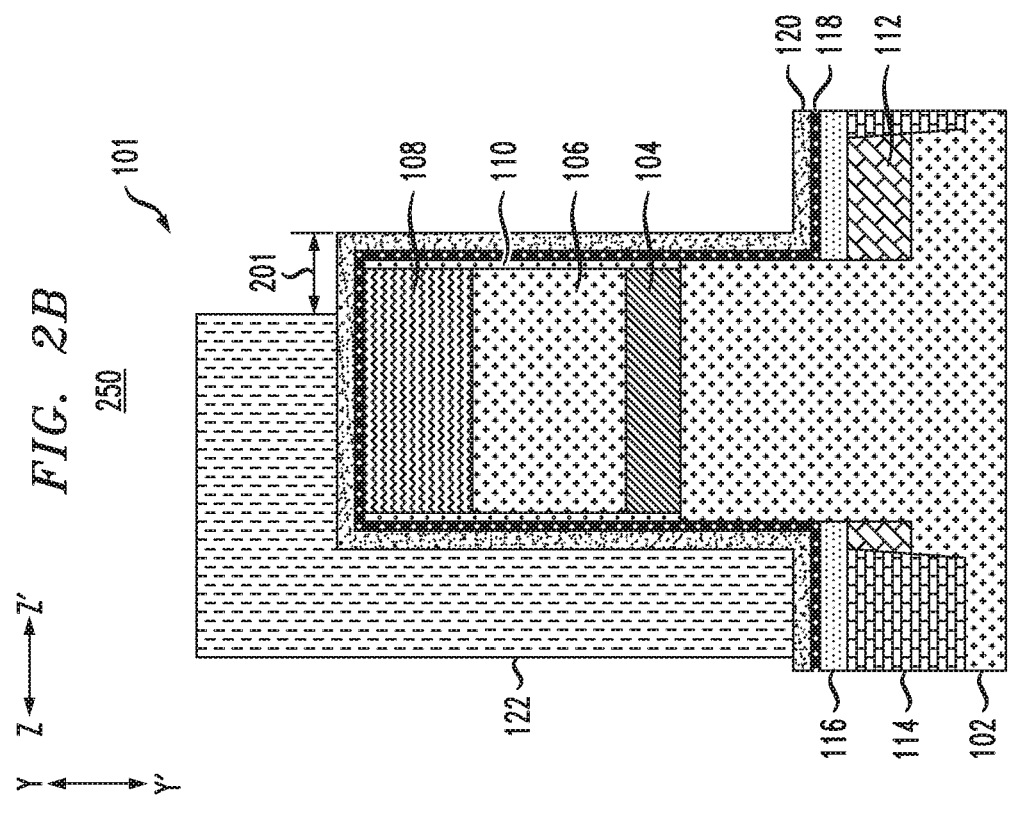
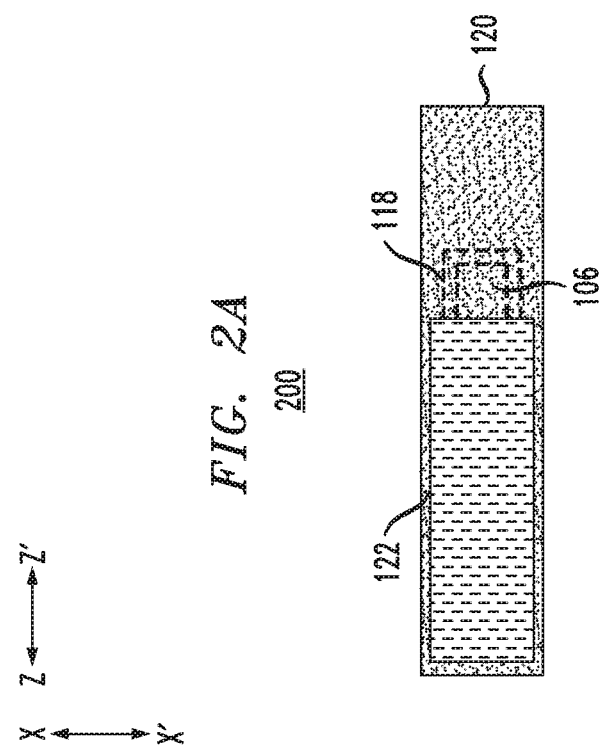

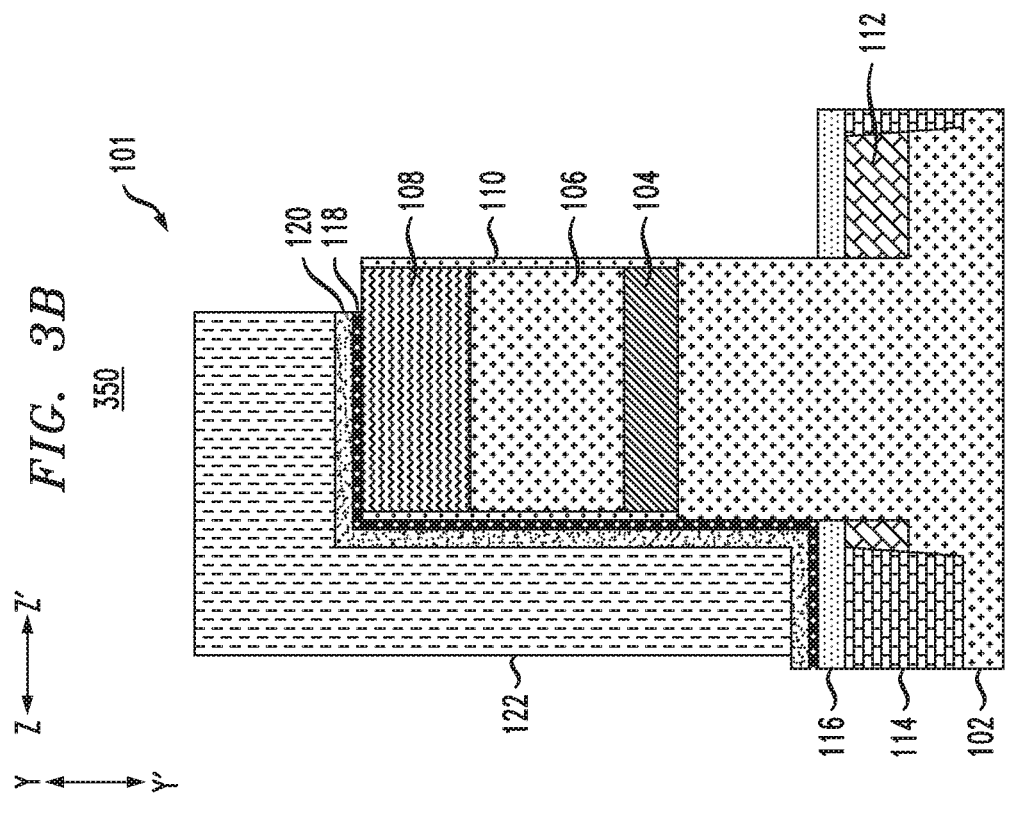
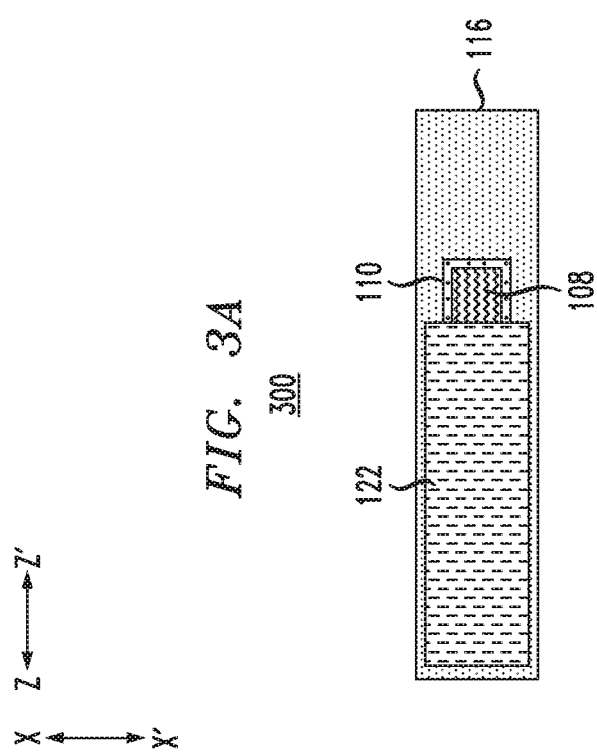
FIG. 3A
FIG. 3B

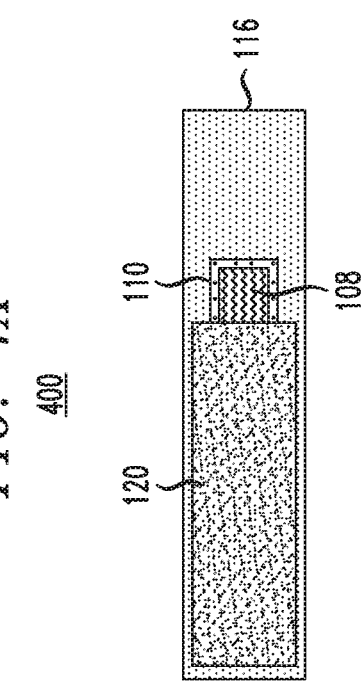
FIG. 4A
400
FIG. 4B
450

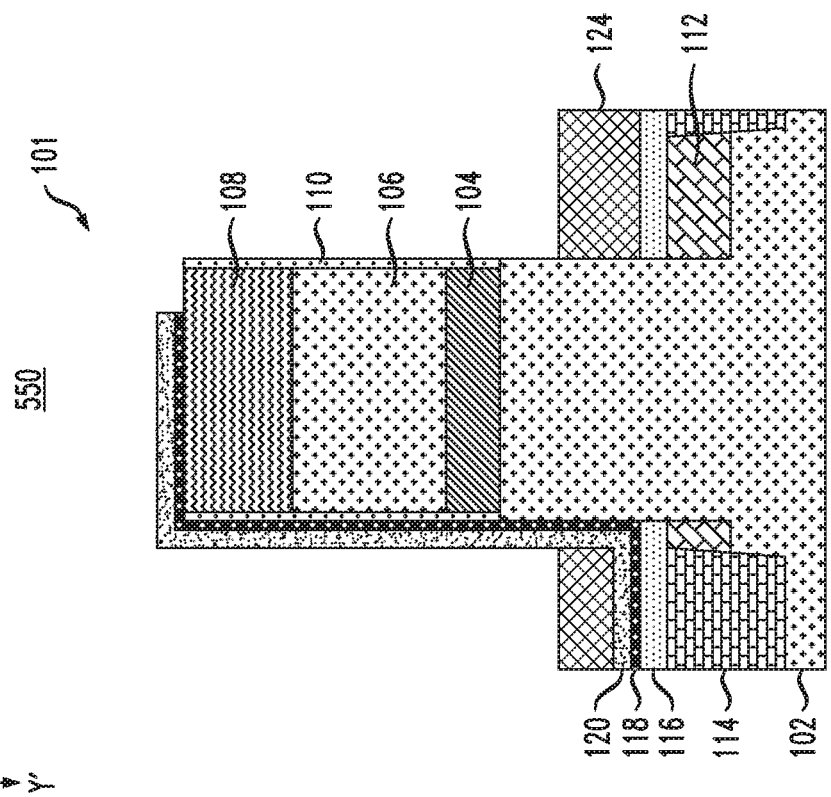

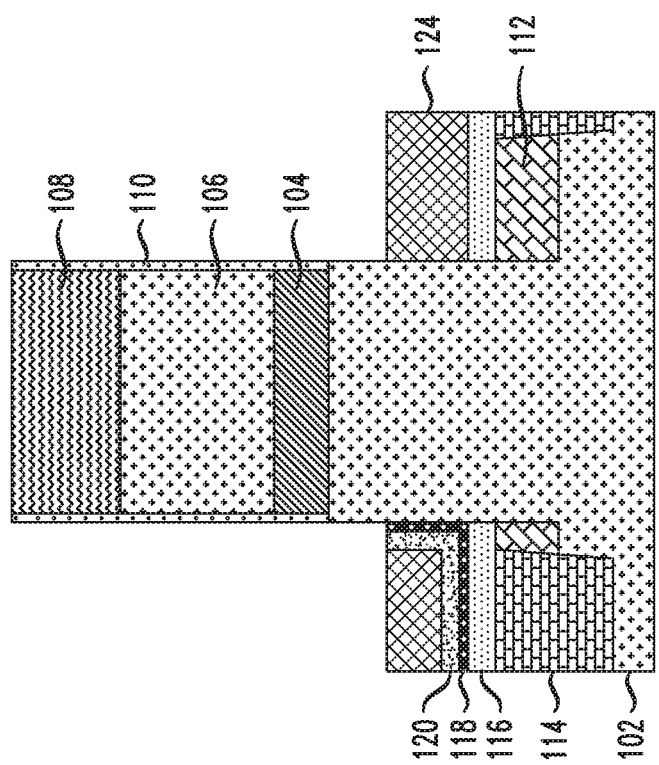
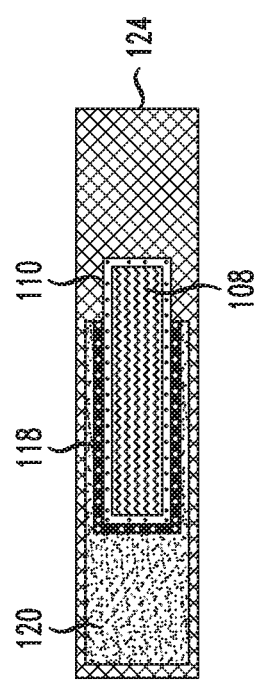

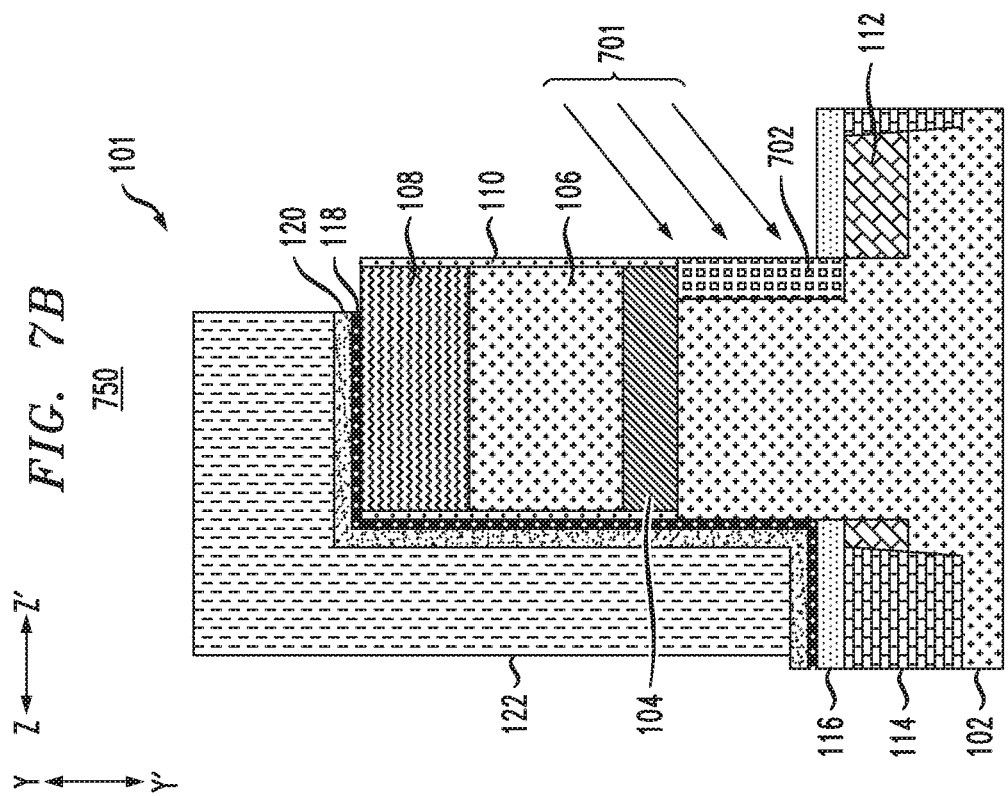
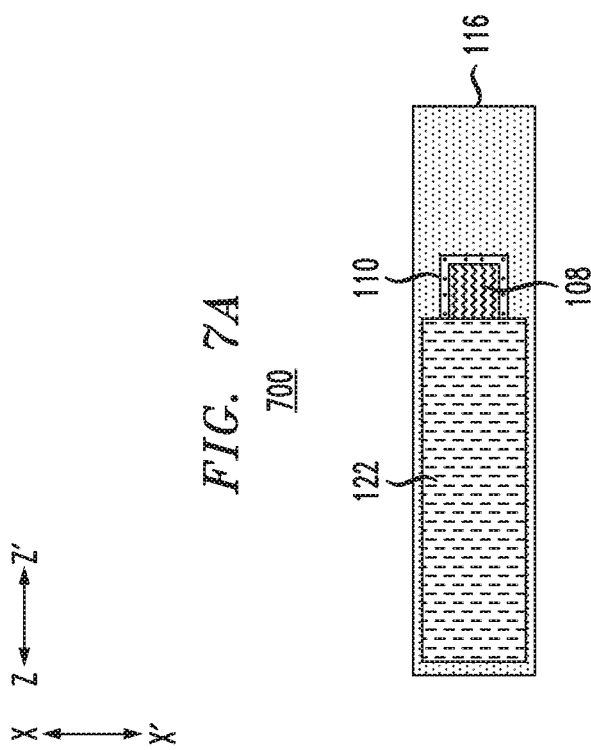
FIG. 7A
700
FIG. 7B
750

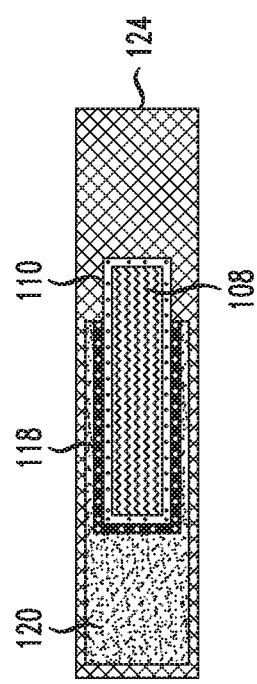
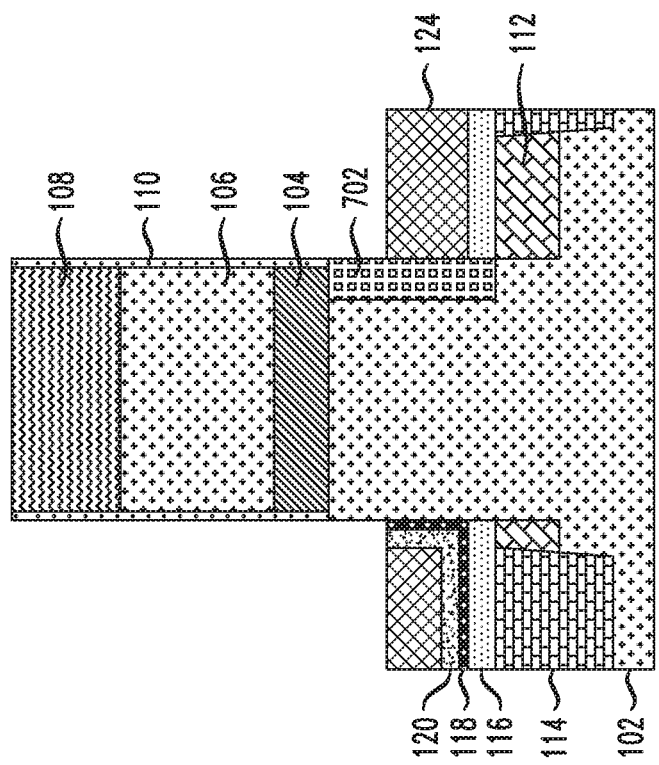

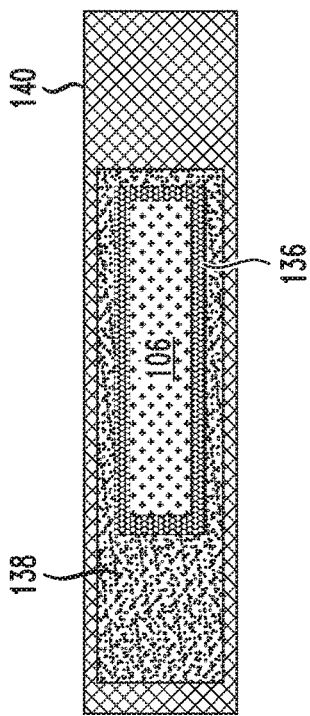
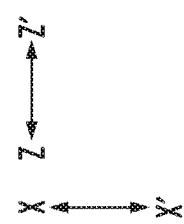
FIG. 9B
950
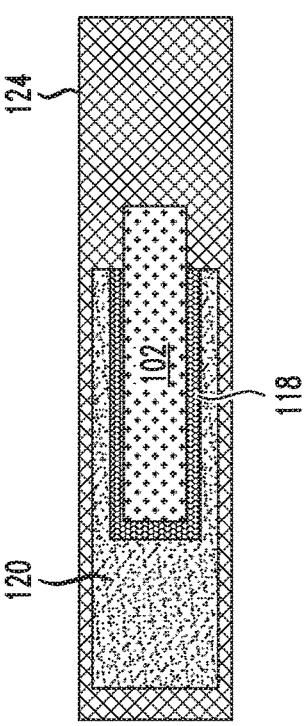
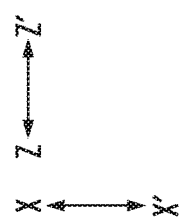
FIG. 9A
900

DIFFERENT GATE WIDTHS FOR UPPER AND LOWER TRANSISTORS IN A STACKED VERTICAL TRANSPORT FIELD-EFFECT TRANSISTOR STRUCTURE

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming different gate widths for upper and lower vertical transport field-effect transistors of a stacked vertical transport field-effect transistor structure.

In one embodiment, a method of forming a semiconductor structure comprises forming one or more vertical fins each comprising a first semiconductor layer providing a vertical transport channel for a lower vertical transport field-effect transistor of a stacked vertical transport field-effect transistor structure, an isolation layer over the first semiconductor layer, and a second semiconductor layer over the isolation layer providing a vertical transport channel for an upper vertical transport field-effect transistor of the stacked vertical transport field-effect transistor structure. The method also comprises forming a first gate stack for the lower vertical transport field-effect transistor comprising a first gate dielectric layer and a first gate conductor layer, the first gate stack surrounding a first portion of the first semiconductor layer of each of the one or more vertical fins. The method further comprises forming a second gate stack for the upper vertical transport field-effect transistor comprising a second gate dielectric layer and a second gate conductor layer, the second gate stack surrounding a second portion of the second semiconductor layer of each of the one or more vertical fins. A size of the first portion is different than a size of the second portion such that the lower vertical transport field-effect transistor and the upper vertical transport field-effect transistor have different effective gate widths.

In another embodiment, a semiconductor structure comprises one or more vertical fins each comprising a first semiconductor layer providing a vertical transport channel for a lower vertical transport field-effect transistor of a stacked vertical transport field-effect transistor structure, an isolation layer over the first semiconductor layer, and a second semiconductor layer over the isolation layer providing a vertical transport channel for an upper vertical transport field-effect transistor of the stacked vertical transport field-effect transistor structure. The semiconductor structure also comprises a first gate stack for the lower vertical transport field-effect transistor comprising a first gate dielectric layer and a first gate conductor layer, the first gate stack surrounding a first portion of the first semiconductor layer of each of the one or more vertical fins. The semiconductor structure further comprises a second gate stack for the upper vertical transport field-effect transistor comprising a second gate dielectric layer and a second gate conductor layer, the second gate stack surrounding a second portion of the second semiconductor layer of each of the one or more vertical fins. A size of the first portion is different than a size of the second portion such that the lower vertical transport field-effect transistor and the upper vertical transport field-effect transistor have different effective gate widths.

In another embodiment, an integrated circuit comprises a stacked vertical transport field-effect transistor structure. The stacked vertical transport field-effect transistor comprises one or more vertical fins each comprising a first semiconductor layer providing a vertical transport channel for a lower vertical transport field-effect transistor of the stacked vertical transport field-effect transistor structure, an isolation layer over the first semiconductor layer, and a second semiconductor layer over the isolation layer providing a vertical transport channel for an upper vertical transport field-effect transistor of the stacked vertical transport field-effect transistor structure. The stacked vertical transport field-effect transistor also comprises a first gate stack for the lower vertical transport field-effect transistor comprising a first gate dielectric layer and a first gate conductor layer, the first gate stack surrounding a first portion of the first semiconductor layer of each of the one or more vertical fins. The stacked vertical transport field-effect transistor further comprises a second gate stack for the upper vertical transport field-effect transistor comprising a second gate dielectric layer and a second gate conductor layer, the second gate stack surrounding a second portion of the second semiconductor layer of each of the one or more vertical fins. A size of the first portion is different than a size of the second portion such that the lower vertical transport field-effect transistor and the upper vertical transport field-effect transistor have different effective gate widths.

BRIEF DESCRIPTION OF THE DRAWINGS

FIG. 1A depicts a top-down view of a semiconductor structure following deposition of gate stack materials for a lower vertical transport field-effect transistor of a stacked vertical transport field-effect transistor structure, according to an embodiment of the invention.

FIG. 1B depicts a cross-sectional view of the FIG. 1A structure, according to an embodiment of the invention.

FIG. 2A depicts a top-down view of the structure shown in FIGS. 1A and 1B following patterning of a mask layer, according to an embodiment of the invention.

FIG. 2B depicts a cross-sectional view of the FIG. 2A structure, according to an embodiment of the invention.

FIG. 3A depicts a top-down view of the structure shown in FIGS. 2A and 2B following removal of portions of the gate stack materials exposed by the mask layer, according to an embodiment of the invention.

FIG. 3B depicts a cross-sectional view of the FIG. 3A structure, according to an embodiment of the invention.

FIG. 4A depicts a top-down view of the structure shown in FIGS. 3A and 3B following removal of the mask layer, according to an embodiment of the invention.

FIG. 4B depicts a cross-sectional view of the FIG. 4A structure, according to an embodiment of the invention.

FIG. 5A depicts a top-down view of the structure shown in FIGS. 4A and 4B following deposition of an interlayer dielectric layer, according to an embodiment of the invention.

FIG. 5B depicts a cross-sectional view of the FIG. 5A structure, according to an embodiment of the invention.

FIG. 6A depicts a top-down view of the structure shown in FIGS. 5A and 5B following removal of exposed portions of the gate stack materials, according to an embodiment of the invention.

FIG. 6B depicts a cross-sectional view of the FIG. 6A structure, according to an embodiment of the invention.

FIG. 7A depicts a top-down view of the structure shown in FIGS. 3A and 3B following shallow tilted ion implantation, according to an embodiment of the invention.

FIG. 7B depicts a cross-sectional view of the FIG. 7A structure, according to an embodiment of the invention.

FIG. 8A depicts a top-down view of the structure shown in FIGS. 7A and 7B following removal of the mask layer, formation of an interlayer dielectric layer, and removal of exposed portions of the gate stack materials, according to an embodiment of the invention.

FIG. 8B depicts a cross-sectional view of the FIG. 8A structure, according to an embodiment of the invention.

FIG. 9A depicts a first cross-sectional view taken across a gate stack of an upper vertical transport field-effect transistor of a stacked vertical transport field-effect transistor structure having a first gate width, according to an embodiment of the invention.

FIG. 9B depicts a second cross-sectional view taken across a gate stack of a lower vertical transport field-effect transistor of the stacked vertical transport field-effect transistor structure having a second gate width different than the first gate width, according to an embodiment of the invention.

DETAILED DESCRIPTION

Figure 9C:
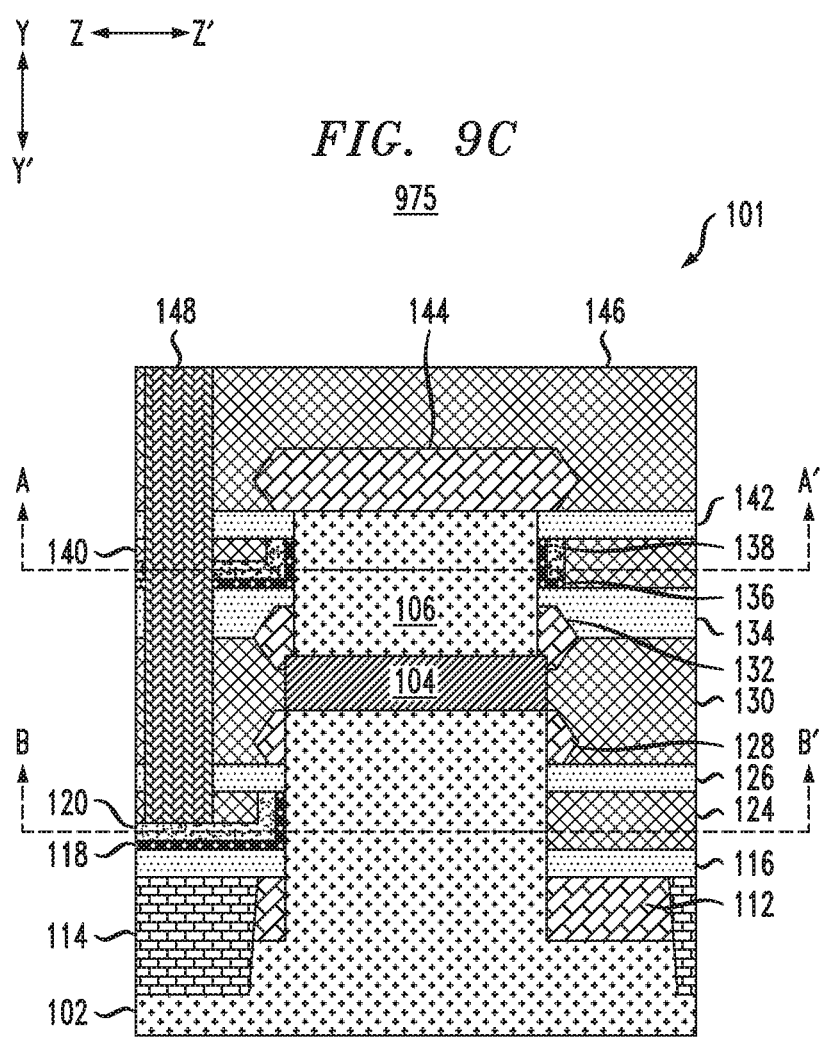
FIG. 9C depicts a third cross-sectional view of the stacked vertical transport field-effect transistor structure shown in FIGS. 9A and 9B, according to an embodiment of the invention.

Illustrative embodiments of the invention may be described herein in the context of illustrative methods for forming different gate widths for upper and lower vertical transport field-effect transistors of a stacked vertical transport field-effect transistor structure, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Stacking FETs in a vertical direction gives an additional dimension for CMOS area scaling. It is difficult, however, to stack planar FETs. Vertical transport FETs (VTFETs) are being pursued as viable CMOS architectures for scaling to 5 nanometers (nm) and beyond. VTFETs provide the opportunity for further device scaling compared with other device architectures. VTFETs have various potential advantages over other conventional structures such as fin field-effect transistors (FinFETs). Such advantages may include improvements in density, performance, power consumption, and integration. Stacking VTFETs may provide further advantages in reducing the area and enabling a denser circuit layout.

For future technology nodes (e.g., to 5 nm and beyond), VTFET MOSFETs are a promising approach. Stacked VTFETs, as noted above, can further reduce the area enabling denser circuit layouts. Due to the stacked nature of stacked VTFET structures, the fin width and length of the upper and lower VTFETs (e.g., which may include one nFET and one pFET) are the same. For certain circuits and layout designs, however, different effective widths ($W_{eff}$) are needed for nFET and pFET devices which are currently unavailable in stacked VTFET structures. Illustrative embodiments provide techniques that enable different $W_{eff}$ for the upper and lower VTFETs in a stacked VTFET structure (e.g., different $W_{eff}$ for an nFET lower VTFET and a pFET upper VTFET) on the same stacked fin without requiring complicated fin trimming or fin chopping processes. Different $W_{eff}$ for the upper and lower VTFETs of a stacked VTFET structure is useful in a wide variety of circuit layouts and designs, including by way of example static random-access memory (SRAM) devices with pFET pass gates.

To provide different $W_{eff}$ for the upper and lower VTFETs of a stacked VTFET structure, some embodiments alter the amount of the fin that is covered or surrounded by the upper and lower gate stacks. The techniques described herein use different gate stack etch processes to alter the amount of the vertical fin that is covered by the gate stack in the upper and lower VTFETs thus realizing different $W_{eff}$ for the upper and lower VTFETs.

Some embodiments further provide for amorphizing a section of the fin for the lower VTFET (e.g., for an nFET device). Amorphized regions of the fin (e.g., amorphous silicon (a-Si)) are not conductive as compared with polycrystalline regions of the fin which are conductive. Counter-doping may be used to provide such amorphized regions, where exposed portions of the fin not covered by the gate stack for the lower VTFET are doped with an opposite dopant for the type of device used in the lower VTFET. For example, the lower VTFET may provide an nFET device that is counter-doped with p-type dopants.

Illustrative embodiments for enabling different gate widths or $W_{eff}$ for the upper and lower VTFETs of a stacked VTFET structure will now be described with respect to FIGS. 1A-9C.

FIG. 1A shows a top-down view 100 of a semiconductor structure following deposition of gate stack materials for a lower VTFET of a stacked VTFET structure. FIG. 1B shows a cross-sectional view 150 of the structure shown in FIG. 1A. The cross-sectional view 150 of FIG. 1B (as well as the cross-sectional views in FIGS. 2B, 3B, 4B, 5B, 6B, 7B and 8B described below) are cross-sectional views "along" vertical fin 101. The structure shown in FIGS. 1A and 1B includes a substrate 102 that provides a lower portion of the vertical fin 101 for the lower VTFET below an isolation layer 104. A semiconductor layer 106 is provided over the isolation layer 104 to provide an upper portion of the vertical fin 101 for the upper VTFET. The upper and lower portions of the vertical fin 101 provide vertical transport channels for respective VTFETs.

In some embodiments, the upper and lower portions of the vertical fin 101 provide vertical transport channels for a same type of VTFET (e.g., one of nFETs and pFETs). In other embodiments, the upper and lower portions of the vertical fin 101 provide vertical transport channels for different types of VTFETs. In the description below, for example, it is assumed that the lower portion of the vertical fin 101 providing the lower VTFET is used to form an nFET device while the upper portion of the vertical fin 101 providing the upper VTFET is used to form a pFET device. It should be appreciated, however, that in other embodiments the lower VTFET may be a pFET while the upper VTFET is an nFET.

The "length" (in direction Z-Z') of the vertical fin 101 (in direction X-X') may be in the range of 20 to 200 nm, while the "width" (in direction X-X') of the vertical fin 101 (in direction X-X') may be in the range of 6 to 10 nm. A "height" (in direction Y-Y') of the lower portion of the vertical fin 101 provided by a portion the substrate 102 may be in the range of 30 to 70 nm. A "height" (in direction Y-Y') of the upper portion of the vertical fin 101 provided by the semiconductor layer 106 may be in the range of 30 to 70 nm.

The semiconductor layer 106 and insulator layer 104 may form a thin buried oxide (BOX) silicon-on-insulator (SOI).

The substrate 102 and semiconductor layer 106 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The substrate 102 and semiconductor layer 106 may have the same or different crystalline orientations, depending on the types of VTFET devices that are to be formed from the FIG. 1 structure. In some embodiments, for example, the substrate 102 and semiconductor layer 106 have different crystalline orientations for formation of nFET and pFET devices. For example, a first crystalline orientation (110) may be used for formation of nFET devices and a second crystalline orientation (100) may be used for formation of pFET devices.

For clarity of illustration, FIGS. 1-9 are shown and described with respect to forming a stacked VTFET structure with just two VTFETs vertically stacked (e.g., in direction Y-Y'). In other embodiments, however, a stacked VTFET structure may include three or more VTFETs vertically stacked.

The horizontal thickness or width (in direction X-X') of the structure may vary, such as based on the number of fins that are to be formed therefrom as described in further detail below. In FIGS. 1A-9C, for clarity of illustration, just a single vertical fin 101 is shown.

The insulator layer 104 may be formed of silicon dioxide ($SiO_2$), silicon nitride (SiN), silicon oxycarbide (SiOC), or any suitable dielectric material that provides for N—P isolation. The insulator layer 104 may have a height or vertical thickness (in direction Y-Y') in the range of 10 to 20 nm.

The vertical fin 101 may be formed by patterning hard mask (HM) layer 108 over a top surface of the semiconductor layer 106, followed by etching exposed portions of the semiconductor layer 106, insulator layer 104 and part of the substrate 102. The vertical fin 101, for example, may be formed using sidewall image transfer (SIT) or other suitable techniques such as lithography and etching including reactive-ion etching (RIE), etc.

The HM layer 108 may be formed of a nitride such as SiN, although other suitable materials may be used. The HM layer 108, in some embodiments, may be formed as a multi-layer, such as a multi-layer of two layers including a nitride and oxide (e.g., SiN and $SiO_2$), a multi-layer of three layers including one or more nitride and one or more oxide layers (e.g., $SiN/SiO_2/SiN$, $SiO_2/SiN/SiO_2$), etc. The layer HM 108 may have a height or vertical thickness (in direction Y-Y') in the range of 10 nm to 100 nm.

The vertical fin 101 may be formed using multiple etchings, such as by etching through the semiconductor layer 106 and insulator layer 104, followed by forming a liner 110 on exposed sidewalls of the insulator layer 104 and semiconductor layer 106. The liner 110 may be used to protect the upper portion of the vertical fin 101 while forming the lower VTFET. The substrate 102 may then be etched further to provide the lower portion of the vertical fin 101.

Bottom source/drain region 112 for the lower VTFET is formed surrounding a bottom of the vertical fin 101 as illustrated. The bottom source/drain region 112 may have a height or vertical thickness (in direction Y-Y') in the range of 15 to 30 nm. The bottom source/drain region 112 may have a width or horizontal thickness (in direction X-X') in the range of 40 to 60 nm.

The bottom source/drain region 112 may be formed, for example, by implantation of a suitable dopant, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The bottom source/drain region 112 may also be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration can range from $1 \times 10^{19}$ cm$^{-3}$ to $3 \times 10^{21}$ cm$^{-3}$, or preferably between $2 \times 10^{20}$ cm$^{-3}$ to $3 \times 10^{21}$ cm$^{-3}$.

The bottom/source drain region 112 is surrounded by a shallow trench isolation (STI) region or layer 114. The STI layer 114 may have a height or vertical thickness (in direction Y-Y') in the range of 50 to 400 nm.

A bottom spacer 116 for the lower VTFET is formed surrounding part of the lower portion of the vertical fin 101 above the bottom source/drain region 112 and the STI layer 114.

The bottom spacer 116 may be formed using various processing, such as non-conformal deposition and etch-back processing (e.g., physical vapor deposition (PVD), high density plasma (HDP) deposition, etc.). The bottom spacer 116 may be formed of a dielectric material such as SiO$_2$, SiN, silicon carbide oxide (SiCO), silicon boron carbide nitride (SiBCN), etc. The bottom spacer 116 may have a height or vertical thickness (in direction Y-Y') in the range of 3 to 10 nm.

Above the bottom spacer 116, gate stack materials for the lower VTFET are formed. The gate stack materials include a gate dielectric layer 118 and a gate conductor layer 120.

The gate dielectric layer 118 may be formed of a high-k dielectric material. Examples of high-k materials include but are not limited to metal oxides such as hafnium oxide (HfO$_2$), hafnium silicon oxide (Hf—Si—O), hafnium silicon oxynitride (HfSiON), lanthanum oxide (La$_2$O$_3$), lanthanum aluminum oxide (LaAlO$_3$), zirconium oxide (ZrO$_2$), zirconium silicon oxide, zirconium silicon oxynitride, tantalum oxide (TazO$_2$O), titanium oxide (TiO$_2$), barium strontium titanium oxide, barium titanium oxide, strontium titanium oxide, yttrium oxide (Y$_2$O$_3$), aluminum oxide (Al$_2$O$_3$), lead scandium tantalum oxide, and lead zinc niobate. The high-k material may further include dopants such as lanthanum (La), aluminum (Al), and magnesium (Mg). The gate dielectric layer 118 may have a uniform thickness in the range of 1 nm to 3 nm.

The gate conductor layer 120 may include a metal gate or work function metal (WFM). In some embodiments, the gate conductor layer 120 is formed using atomic layer deposition (ALD) or another suitable process. For nFET devices, the WFM for the gate conductor may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may be TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor as desired. The gate conductor layer 120 may have a uniform thickness in the range of 5 to 20 nm.

In the top-down view 100 of FIG. 1A, the semiconductor layer 106 and gate dielectric layer 118 are shown in dashed outline to show where they are "below" the gate conductor layer 120.

FIG. 2A shows a top-down view 200 of the structure shown in FIGS. 1A and 1B, following patterning of a mask layer 122 over a portion of the vertical fin 101. FIG. 2B shows a cross-sectional view 250 of the structure shown in FIG. 2A. The mask layer 122 may comprise photoresist or another suitable masking material. The mask layer 122, as shown in FIGS. 2A and 2B, overfills the structure and leaves part of the vertical fin 101 uncovered (e.g., exposing a portion of the gate stack materials). The length 201 of the exposed portion of the vertical fin (in direction Z-Z') may vary based on the desired gate width for the lower VTFET. In some embodiments, the length 201 is in the range of 10 to 50 nm.

FIG. 3A shows a top-down view 300 of the structure shown in FIGS. 2A and 2B, following removal of portions of the gate stack materials that are exposed by the mask layer 122. FIG. 3B shows a cross-sectional view 350 of the structure shown in FIG. 3A. The gate stack materials may be removed using a wet etch chemistry or an isotropic dry etch process.

FIG. 4A shows a top-down view 400 of the structure shown in FIGS. 3A and 3B, following removal of the mask layer 122. FIG. 4B shows a cross-sectional view 450 of the structure shown in FIG. 4A.

FIG. 5A shows a top-down view 500 of the structure shown in FIGS. 4A and 4B, following deposition of an interlayer dielectric (ILD) layer 124. FIG. 5B shows a cross-sectional view 550 of the structure shown in FIG. 5A. The material of the ILD layer 124 may initially be formed to fill the structure (e.g., with formation of a liner first, where the liner may be SiN), followed by chemical mechanical planarization (CMP) and etch-back. Alternatively, the material of the ILD layer 124 may be formed using HDP and etch-back processing to result in the ILD layer 124 as shown in FIGS. 5A and 5B. The ILD layer 124 may be formed of any suitable isolation material, including but not limited to SiO$_2$, SiOC, SiON, etc. The height or vertical thickness (in direction Y-Y') of the ILD layer 124 may be in the range of 10 to 30 nm, and defines the height of the gate stack for the lower VTFET.

FIG. 6A shows a top-down view 600 of the structure shown in FIGS. 5A and 5B, following removal of the exposed portions of the gate stack materials (gate dielectric layer 118 and gate conductor layer 120) formed above a top surface of the ILD layer 124. FIG. 6B shows a cross-sectional view 650 of the structure shown in FIG. 6A.

FIG. 7A shows a top-down view 700 of the structure shown in FIGS. 3A and 3B, following shallow tilted ion implantation 701 to form an amorphized region 702 in the lower portion of the vertical fin 101. FIG. 7B shows a cross-sectional view 750 of the structure shown in FIG. 7A. The shallow tilted ion implantation 701 may utilize dopants that counter-dope the lower portion of the vertical fin 101. For example, assuming that the lower VTFET is used to provide an nFET device, the shallow tilted ion implantation 701 may utilize p-type dopants (e.g., B, Ga, etc). The shallow tilted ion implantation 701 may also or alternatively utilize Si and Ge dopants to form the amorphized region 702. The shallow tilted ion implantation 701 transforms the exposed lower portion of the vertical fin 101 (e.g., which may be formed of Si) from a crystalline (conducting) to an amorphous (non-conducting) structure.

FIG. 8A shows a top-down view 800 of the structure shown in FIGS. 7A and 7B following removal of the mask layer 122, formation of ILD layer 124 and removal of exposed portions of the gate stack materials (gate dielectric layer 118 and gate conductor layer 120) using processing similar to that described above with respect to FIGS. 5 and 6. FIG. 8B shows a cross-sectional view 850 of the structure shown in FIG. 8A.

FIGS. 9A, 9B and 9C show first, second and third cross-sectional view 900, 950 and 975, respectively, of the structure shown in FIGS. 6A and 6B following additional processing to form the stacked VTFET structure. The first cross-sectional view 900 is taken along the line A-A' shown in the third cross-sectional view 975, and the second cross-sectional view 950 is taken along the line B-B' in the third cross-sectional view 975. The first cross-sectional view 900 is a "top-up" view taken across the gate stack for the upper VTFET, while the second cross-sectional view 950 is a "top-up" view taken across the gate stack for the lower VTFET. As illustrated in FIGS. 9A through 9C, the upper and lower VTFETs have different gate widths or $W_{eff}$. The gate stack for the lower VTFET surrounds only a portion of the vertical fin 101 (using the processing described above with respect to FIGS. 1-8), while the gate stack for the upper VTFET surrounds the entire vertical fin 101.

It should be noted that FIGS. 9A through 9C show the structure of FIGS. 6A and 6B following the formation of a number of additional layers 126 through 148. The structure of FIGS. 8A and 8B may similarly be subject to additional processing to form layers 126 through 148, though in that case the lower portion of the vertical fin includes the amorphized region 702.

Top spacer 126 for the lower VTFET is formed surrounding part of the vertical fin 101 above the ILD 124. The top spacer 126 may be formed of similar materials and with similar sizing as that described above with respect to bottom spacer 116.

Top source/drain region 128 for the lower VTFET is formed over the top spacer 126 surrounding a remaining portion of the vertical fin 101 below the isolation layer 104. The top source/drain region 128 may be formed of similar materials and with similar processing as that described above with respect to bottom source/drain regions 112. The top source/drain region 128 may have a height or vertical thickness (in direction Y-Y') in the range of 10 to 30 nm, and may have a width or horizontal thickness (in direction X-X') in the range of 5 to 15 nm.

An isolation or ILD layer 130 surrounds the top source/drain region 128 and isolation layer 104. The ILD layer 130 may be formed of similar materials as those described above with respect to ILD 124, and may have a height or vertical thickness (in direction Y-Y') in the range of 20 to 40 nm.

Bottom source/drain region 132 for the upper VTFET is formed over the ILD layer 130 and surrounding a portion of the sidewalls of the semiconductor layer 106 providing an upper portion of the vertical fin 101. The bottom source/drain region 132 may be formed of similar materials and with similar processing as that described above with respect to bottom source/drain region 114. The bottom source/drain region 132 may have a height or vertical thickness (in direction Y-Y') in the range of 10 to 30 nm, and may have a width or horizontal thickness (in direction X-X') in the range of 5 to 15 nm.

Bottom spacer 134 is formed surrounding the bottom source/drain region 132 and a portion of the vertical sidewalls of the vertical fin 101 above the top surface of the bottom source/drain region 132. The bottom spacer 134 may be formed of similar materials as the bottom spacer 116. The bottom spacer 134 may have a height or vertical thickness (in direction Y-Y') in the range of 10 to 30 nm, provided that the bottom spacer 134 must be formed with a greater height than that of the bottom source/drain region 132 so as to provide a buffer between the bottom source/drain region 132 and the gate stack of the upper VTFETs.

The gate stack for the upper VTFET is formed surrounding a portion of the vertical fin 101 above the bottom spacer 134. The gate stack for the upper VTFET, similar to the gate stack for the lower VTFET, includes a gate dielectric layer 136 and a gate conductor layer 138. The gate dielectric layer 136 and gate conductor layer 138 may be formed of similar materials and with similar sizing as that described above with respect to the gate dielectric layer 118 and gate conductor layer 120 of the lower VTFET. The gate conductor layers 120 and 138 may be formed of different materials as noted above depending on the type of VTFET that is being formed (e.g., nFET or pFET).

Although not shown in FIGS. 9A through 9C, an interfacial layer may be formed between the gate stacks and the sidewalls of the vertical fin 101. The interfacial layer may be formed of $SiO_2$ or another suitable material such as silicon oxynitride ($SiO_xN_y$). The interfacial layer may have a thickness ranging from 0.5 nm to 1.5 nm.

ILD layer 140 is formed surrounding the gate stack of the upper VTFET. The ILD layer 140 may be formed of similar materials and with similar processing as that described above with respect to the ILD layer 124.

Top spacer 142 for the upper VTFET is formed over the gate stack and the ILD layer 140 and surrounding a remaining portion of sidewalls of the vertical fin 101. The top spacer 142 may be formed of similar materials as the bottom spacer 116. The top spacer 142 may have a height or vertical thickness (in direction Y-Y') in the range of 10 to 30 nm.

Top source/drain region 144 for the upper VTFET is formed over the top surface of the vertical fin 101 as shown. The top source/drain region 144 may be formed of similar materials and using similar processing as that described above with respect to bottom source/drain region 112. The top source/drain region 144 may have a height or vertical thickness (in direction Y-Y') in the range of 10 to 30 nm, and may have a width or horizontal thickness (in direction X-X') in the range of 10 to 30 nm.

ILD layer 146 is formed surrounding the top source/drain region 144. The ILD layer 146 may be formed of similar materials as those described above with respect to the ILD layer 124. As shown in FIG. 9C, the ILD layer 146 overfills the structure, and has a height or vertical thickness (in direction Y-Y') that exceeds the top surfaces of the top source/drain region 144, such as a height or vertical thickness in the range of 30 to 70 nm.

A shared contact 148 to the gates of the upper and lower VTFETs of the stacked VTFET structure may be formed by patterning a mask layer over the ILD layer 146, and etching through the underlying layers until the gate stack of the lower VTFET is reached. The shared contact 148 may be formed of a metal such as tungsten (W), or any other suitable material.

In some embodiments, a method of forming a semiconductor structure comprises forming one or more vertical fins each comprising a first semiconductor layer providing a vertical transport channel for a lower VTFET of a stacked VTFET structure, an isolation layer over the first semiconductor layer, and a second semiconductor layer over the isolation layer providing a vertical transport channel for an upper VTFET of the stacked VTFET structure. The method also comprises forming a first gate stack for the lower VTFET comprising a first gate dielectric layer and a first gate conductor layer, the first gate stack surrounding a first portion of the first semiconductor layer of each of the one or more vertical fins. The method further comprises forming a second gate stack for the upper VTFET comprising a second gate dielectric layer and a second gate conductor layer, the second gate stack surrounding a second portion of the second semiconductor layer of each of the one or more vertical fins. A size of the first portion is different than a size of the second portion such that the lower VTFET and the upper VTFET have different effective gate widths.

The size of the first portion may be less than the size of the second portion. The lower VTFET may comprise one of an nFET and pFET, and the upper VTFET may comprise the other one of the nFET and pFET.

One of the first gate stack and the second gate stack may surround all of the sidewalls of the one or more vertical fins, and the other one of the first gate stack and the second gate stack may surround less than all of the sidewalls of the one or more vertical fins. Portions of the sidewalls of the one or more vertical fins exposed by said other one of the first gate stack and the second gate stack may be amorphized. Portions of the one or more vertical fins exposed by said other one of the first gate stack and the second gate stack may be counter-doped with a dopant opposite to a type of the transistor corresponding to said other one of the first gate stack and the second gate stack.

Forming the first gate stack may comprise: forming the first gate dielectric layer over the one or more vertical fins and over a first bottom spacer, the first bottom spacer being formed over (i) a first bottom source/drain region surrounding sidewalls of the one or more vertical fins and (ii) a shallow trench isolation layer surrounding the first bottom source/drain region; forming the first gate conductor layer over the first gate dielectric layer; patterning a mask layer over a portion of the first gate conductor layer; and removing portions of the first gate conductor layer and the first gate dielectric layer exposed by the mask layer to expose a portion of sidewalls of the first semiconductor layer of each of the one or more vertical fins.

Forming the first gate stack may further comprise removing the mask layer, forming a first interlayer dielectric layer over the gate conductor layer and the first bottom spacer surrounding a portion of the exposed sidewalls of the first semiconductor layer of each of the one or more vertical fins, and recessing the first gate dielectric layer and the first gate conductor layer to match a top surface of the first interlayer dielectric layer to provide the first gate stack surrounding the first portion of the first semiconductor layer of each of the one or more vertical fins.

Forming the first gate stack may further comprise performing shallow tilted ion implantation to transform the exposed portion of the sidewalls of the first semiconductor layer of each of the one or more vertical fins from a conducting material to a non-conducting material, removing the mask layer, forming a first interlayer dielectric layer over the gate conductor layer and the first bottom spacer surrounding a portion of the exposed sidewalls of the first semiconductor layer of each of the one or more vertical fins, and recessing the first gate dielectric layer and the first gate conductor layer to match a top surface of the first interlayer dielectric layer to provide the first gate stack surrounding the first portion of the first semiconductor layer of each of the one or more vertical fins.

Transforming the exposed portion of the sidewalls of the first semiconductor layer of each of the one or more vertical fins from the conducting material to the non-conducting material may comprise transforming a crystalline material of the first semiconductor layer to an amorphous material.

Transforming the exposed portion of the sidewalls of the first semiconductor layer of each of the one or more vertical fins from the conducting material to the non-conducting material comprises counter-doping material of the first semiconductor layer with a dopant type opposite to a field-effect transistor type of the lower VTFET. The lower VTFET may comprise an n-type field-effect transistor, and the shallow tilted ion implantation may utilize at least one of a Ge, Si, B and Ga dopant.

In some embodiments, a semiconductor structure comprises one or more vertical fins each comprising a first semiconductor layer providing a vertical transport channel for a lower VTFET of a stacked VTFET structure, an isolation layer over the first semiconductor layer, and a second semiconductor layer over the isolation layer providing a vertical transport channel for an upper VTFET of the stacked VTFET structure. The semiconductor structure also comprises a first gate stack for the lower VTFET comprising a first gate dielectric layer and a first gate conductor layer, the first gate stack surrounding a first portion of the first semiconductor layer of each of the one or more vertical fins. The semiconductor structure further comprises a second gate stack for the upper VTFET comprising a second gate dielectric layer and a second gate conductor layer, the second gate stack surrounding a second portion of the second semiconductor layer of each of the one or more vertical fins. A size of the first portion is different than a size of the second portion such that the lower VTFET and the upper VTFET have different effective gate widths.

The size of the first portion may be less than the size of the second portion.

One of the first gate stack and the second gate stack may surround all of the sidewalls of the one or more vertical fins, and the other one of the first gate stack and the second gate stack may surround less than all of the sidewalls of the one or more vertical fins. Portions of the sidewalls of the one or more vertical fins exposed by said other one of the first gate stack and the second gate stack may be amorphized. Portions of the one or more vertical fins exposed by said other one of the first gate stack and the second gate stack may be counter-doped with a dopant opposite to a type of the transistor corresponding to said other one of the first gate stack and the second gate stack.

In some embodiments, an integrated circuit comprises a stacked VTFET structure. The stacked VTFET comprises one or more vertical fins each comprising a first semiconductor layer providing a vertical transport channel for a lower VTFET of the stacked VTFET structure, an isolation layer over the first semiconductor layer, and a second semiconductor layer over the isolation layer providing a vertical transport channel for an upper VTFET of the stacked VTFET structure. The stacked VTFET also comprises a first gate stack for the lower VTFET comprising a first gate dielectric layer and a first gate conductor layer, the first gate stack surrounding a first portion of the first semiconductor layer of each of the one or more vertical fins. The stacked VTFET further comprises a second gate stack for the upper VTFET comprising a second gate dielectric layer and a second gate conductor layer, the second gate stack surrounding a second portion of the second semiconductor layer of each of the one or more vertical fins. A size of the first portion is different than a size of the second portion such that the lower VTFET and the upper VTFET have different effective gate widths.

The size of the first portion may be less than the size of the second portion.

One of the first gate stack and the second gate stack may surround all of the sidewalls of the one or more vertical fins, and the other one of the first gate stack and the second gate stack may surround less than all of the sidewalls of the one or more vertical fins.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
   forming one or more vertical fins each comprising a first semiconductor layer providing a vertical transport channel for a lower vertical transport field-effect transistor of a stacked vertical transport field-effect transistor structure, an isolation layer over the first semiconductor layer, and a second semiconductor layer over the isolation layer providing a vertical transport channel for an upper vertical transport field-effect transistor of the stacked vertical transport field-effect transistor structure;
   forming a first gate stack for the lower vertical transport field-effect transistor comprising a first gate dielectric layer and a first gate conductor layer, the first gate stack surrounding a first portion of the first semiconductor layer of each of the one or more vertical fins; and
   forming a second gate stack for the upper vertical transport field-effect transistor comprising a second gate dielectric layer and a second gate conductor layer, the second gate stack surrounding a second portion of the second semiconductor layer of each of the one or more vertical fins;
   wherein a size of the first portion is different than a size of the second portion such that the lower vertical transport field-effect transistor and the upper vertical transport field-effect transistor have different effective gate widths.

2. The method of claim 1, wherein the size of the first portion is less than the size of the second portion.

3. The method of claim 1, wherein the lower vertical transport field-effect transistor comprises one of an n-type field-effect transistor and a p-type field-effect transistor, and wherein the upper vertical transport field-effect transistor comprises the other one of the n-type field-effect transistor and the p-type field effect transistor.

4. The method of claim 1, wherein one of the first gate stack and the second gate stack surrounds all of the sidewalls of the one or more vertical fins, and wherein the other one of the first gate stack and the second gate stack surrounds less than all of the sidewalls of the one or more vertical fins.

5. The method of claim 4, wherein portions of the sidewalls of the one or more vertical fins exposed by said other one of the first gate stack and the second gate stack are amorphized.

6. The method of claim 4, wherein portions of the one or more vertical fins exposed by said other one of the first gate stack and the second gate stack are counter-doped with a dopant opposite to a type of the transistor corresponding to said other one of the first gate stack and the second gate stack.

7. The method of claim 1, wherein forming the first gate stack comprises:
   forming the first gate dielectric layer over the one or more vertical fins and over a first bottom spacer, the first bottom spacer being formed over (i) a first bottom source/drain region surrounding sidewalls of the one or more vertical fins and (ii) a shallow trench isolation layer surrounding the first bottom source/drain region;
   forming the first gate conductor layer over the first gate dielectric layer;
   patterning a mask layer over a portion of the first gate conductor layer; and
   removing portions of the first gate conductor layer and the first gate dielectric layer exposed by the mask layer to expose a portion of sidewalls of the first semiconductor layer of each of the one or more vertical fins.

8. The method of claim 7, wherein forming the first gate stack further comprises:
   removing the mask layer;
   forming a first interlayer dielectric layer over the gate conductor layer and the first bottom spacer surrounding a portion of the exposed sidewalls of the first semiconductor layer of each of the one or more vertical fins; and
   recessing the first gate dielectric layer and the first gate conductor layer to match a top surface of the first interlayer dielectric layer to provide the first gate stack surrounding the first portion of the first semiconductor layer of each of the one or more vertical fins.

9. The method of claim 7, wherein forming the first gate stack further comprises:
   performing shallow tilted ion implantation to transform the exposed portion of the sidewalls of the first semiconductor layer of each of the one or more vertical fins from a conducting material to a non-conducting material;

removing the mask layer;

forming a first interlayer dielectric layer over the gate conductor layer and the first bottom spacer surrounding a portion of the exposed sidewalls of the first semiconductor layer of each of the one or more vertical fins; and recessing the first gate dielectric layer and the first gate conductor layer to match a top surface of the first interlayer dielectric layer to provide the first gate stack surrounding the first portion of the first semiconductor layer of each of the one or more vertical fins.

10. The method of claim 9, wherein transforming the exposed portion of the sidewalls of the first semiconductor layer of each of the one or more vertical fins from the conducting material to the non-conducting material comprises transforming a crystalline material of the first semiconductor layer to an amorphous material.

11. The method of claim 9, wherein transforming the exposed portion of the sidewalls of the first semiconductor layer of each of the one or more vertical fins from the conducting material to the non-conducting material comprises counter-doping material of the first semiconductor layer with a dopant type opposite to a field-effect transistor type of the lower vertical transport field-effect transistor.

12. The method of claim 9, wherein the lower vertical transport field-effect transistor comprises an n-type field-effect transistor, and wherein the shallow tilted ion implantation utilizes at least one of a germanium (Ge) dopant, a silicon (Si) dopant, a boron (B) dopant and a gallium (Ga) dopant.

13. A semiconductor structure, comprising:
one or more vertical fins each comprising a first semiconductor layer providing a vertical transport channel for a lower vertical transport field-effect transistor of a stacked vertical transport field-effect transistor structure, an isolation layer over the first semiconductor layer, and a second semiconductor layer over the isolation layer providing a vertical transport channel for an upper vertical transport field-effect transistor of the stacked vertical transport field-effect transistor structure;
a first gate stack for the lower vertical transport field-effect transistor comprising a first gate dielectric layer and a first gate conductor layer, the first gate stack surrounding a first portion of the first semiconductor layer of each of the one or more vertical fins; and
a second gate stack for the upper vertical transport field-effect transistor comprising a second gate dielectric layer and a second gate conductor layer, the second gate stack surrounding a second portion of the second semiconductor layer of each of the one or more vertical fins;
wherein a size of the first portion is different than a size of the second portion such that the lower vertical transport field-effect transistor and the upper vertical transport field-effect transistor have different effective gate widths.

14. The semiconductor structure of claim 13, wherein the size of the first portion is less than the size of the second portion.

15. The semiconductor structure of claim 13, wherein one of the first gate stack and the second gate stack surrounds all of the sidewalls of the one or more vertical fins, and wherein the other one of the first gate stack and the second gate stack surrounds less than all of the sidewalls of the one or more vertical fins.

16. The semiconductor structure of claim 15, wherein portions of the sidewalls of the one or more vertical fins exposed by said other one of the first gate stack and the second gate stack are amorphized.

17. The semiconductor structure of claim 15, wherein portions of the one or more vertical fins exposed by said other one of the first gate stack and the second gate stack are counter-doped with a dopant opposite to a type of the transistor corresponding to said other one of the first gate stack and the second gate stack.

18. An integrated circuit comprising:
a stacked vertical transport field-effect transistor structure comprising:
one or more vertical fins each comprising a first semiconductor layer providing a vertical transport channel for a lower vertical transport field-effect transistor of the stacked vertical transport field-effect transistor structure, an isolation layer over the first semiconductor layer, and a second semiconductor layer over the isolation layer providing a vertical transport channel for an upper vertical transport field-effect transistor of the stacked vertical transport field-effect transistor structure;
a first gate stack for the lower vertical transport field-effect transistor comprising a first gate dielectric layer and a first gate conductor layer, the first gate stack surrounding a first portion of the first semiconductor layer of each of the one or more vertical fins; and
a second gate stack for the upper vertical transport field-effect transistor comprising a second gate dielectric layer and a second gate conductor layer, the second gate stack surrounding a second portion of the second semiconductor layer of each of the one or more vertical fins;
wherein a size of the first portion is different than a size of the second portion such that the lower vertical transport field-effect transistor and the upper vertical transport field-effect transistor have different effective gate widths.

19. The integrated circuit of claim 18, wherein the size of the first portion is less than the size of the second portion.

20. The integrated circuit of claim 18, wherein one of the first gate stack and the second gate stack surrounds all of the sidewalls of the one or more vertical fins, and wherein the other one of the first gate stack and the second gate stack surrounds less than all of the sidewalls of the one or more vertical fins.

* * * * *